United States Patent
Watanabe et al.

(10) Patent No.: US 6,914,470 B2
(45) Date of Patent: Jul. 5, 2005

(54) LEVEL SHIFTING CIRCUIT

(76) Inventors: Hiroshi Watanabe, 4-7-2-302 Kasuga-cho, Nerima-ku, Tokyo, Nerima-ku (JP), 179-0074; Kohji Takeda, 5283-10 Kawasaki, Hiji-machi, Hayami-gun, Oita, Hayami-gun (JP), 879-1505

(*) Notice: Subject to any disclaimer, the term of this patent is extended or adjusted under 35 U.S.C. 154(b) by 0 days.

(21) Appl. No.: 10/672,540

(22) Filed: Sep. 26, 2003

(65) Prior Publication Data

US 2004/0061521 A1 Apr. 1, 2004

(30) Foreign Application Priority Data

Sep. 30, 2002 (JP) .................................. 2002-286637

(51) Int. Cl.⁷ .............................................. H03L 5/00
(52) U.S. Cl. ......................... 327/333; 327/108; 326/81
(58) Field of Search ................................ 327/333, 108, 327/379, 387, 389, 391; 326/62, 63, 68, 80, 81, 86

(56) References Cited

U.S. PATENT DOCUMENTS

| | | | | |
|---|---|---|---|---|
| 4,888,501 A | * | 12/1989 | Sanwo et al. ............... 326/73 |
| 5,680,063 A | * | 10/1997 | Ludwig et al. ............... 326/80 |
| 5,742,183 A | * | 4/1998 | Kuroda ........................ 326/81 |
| 6,069,515 A | * | 5/2000 | Singh ......................... 327/309 |
| 6,400,189 B2 | * | 6/2002 | McDaniel .................... 327/108 |
| 2003/0132794 A1 | * | 7/2003 | Watanabe | |

* cited by examiner

Primary Examiner—Tuan T. Lam
(74) Attorney, Agent, or Firm—William B. Kempler; W. James Brady, III; Frederick J. Telecky, Jr.

(57) ABSTRACT

The present invention provides a circuit to shift the level of an arbitrary input signal level higher than the power supply voltage to a reference logic level controlled by the power supply voltage quickly, reliably, and accurately. When a signal input to port A changes from the low level to the high level, the potential at node $S_1$ is immediately increased to a potential significantly higher than the power supply voltage due to the capacitive coupling of the drain-gate capacitance of NMOS transistor 10, so that NMOS transistor 14 turns on at bias circuit 12 in order to allow current to flow from node $S_1$ to power supply voltage terminal C, and the potential of node $S_1$ is clamped to level $(V_{CC}+V_{TN14})$, that is, above power supply voltage $V_{CC}$ by threshold voltage $V_{TN14}$. As a result, a high level equal to the level below gate potential $(V_{CC}+V_{TN14})$ by threshold voltage $V_{TN10}$, that is, the potential of $V_{CC}$, is obtained at source of NMOS transistor 10, that is, port B.

21 Claims, 4 Drawing Sheets

LEVEL SHIFTING CIRCUIT

FIELD OF THE INVENTION

The present invention pertains to a technique for shifting the signal level of a binary signal. More specifically, it pertains to a level shifting circuit for shifting the levels of various types of input signals to a fixed signal level.

BACKGROUND OF THE INVENTION

In the case of electronic equipment, the widely used conventional power supply voltage of 5 V used widely is reduced to 3.3 V or 2.5 V in order to reduce the IC (integrated circuit) power consumption, and situations which require the provision of an interface between different ICs which use different operating voltages with respect to signal level are increasing. For example, in the case of a system equipped with a PCI bus, while an IC on the core side uses 3.3 V, an IC on the expansion board side may use 3.3 V or 5 V. In such a case, a level shifting circuit is used that allows the core side to receive a signal at the voltage level of 3.3 V regardless of whether the voltage level of a signal from the expansion board side to the core side is 3.3 V or 5 V.

Figures 10, 11:
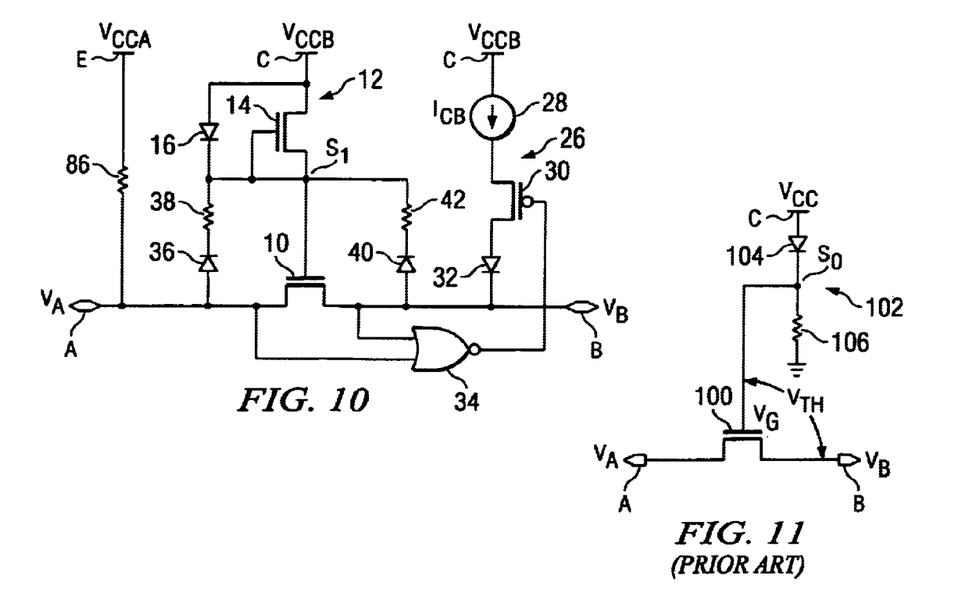
FIG. 10 is a circuit diagram illustrating the circuit configuration of the level shifting circuit in a modification example of an embodiment.
FIG. 11 is a circuit diagram illustrating the circuit configuration of a conventional level shifting circuit.

A conventional level shifting circuit equipped with this type of function is shown in FIG. 11. Said level shifting circuit uses N-channel MOS transistor (referred to as an "NMOS transistor" hereinafter) 100 as a transfer gate transistor. The drain terminal of NMOS transistor 100 is connected at port A to a digital IC (not shown) provided on the sender side, the source terminal is connected at port B to a digital IC (not shown) provided on the receiver side, and its gate terminal is connected to node s0 of bias circuit 102. Bias circuit 102 comprises diode 104 and resistor 106 connected in series between terminal C of power supply voltage $V_{CC}$ and ground, and it supplies fixed voltage $V_{CC}-V_F$ at node s0, of diode 104 and resistor 106 to the gate of NMOS transistor 100 as bias voltage $V_g$. Here, $V_F$ represents the forward voltage drop of diode 104.

For example, to obtain a high level of 3.3 V at port B when a high level of 5 V is input to port A when the receiver side IC uses a 3.3 V system, assuming that the threshold voltage of NMOS transistor 100 is $V_{tn}$, bias voltage $V_g$ should be set so that $V_g - V_{tn} = 3.3$ V. That is, in general, the receiver side IC is a capacitive load when seen from port B, so that the source voltage (potential at port B) is restricted to level $(V_g - V_{tn})$, that is, the level obtained when gate voltage $V_g$ has been reduced by threshold voltage $V_{tn}$, at NMOS transistor 100 regardless of the drain voltage (potential at port A), and the on-state in the saturation region is stabilized at said level. Therefore, to obtain an H level of 3.3 V at port B when power supply voltage $V_{CC}$ is 5 V and threshold voltage $V_{tn}$ of NMOS transistor 100 is 0.9 V, bias voltage $V_g$ should be set to 4.2 V, and 0.8 V should be selected for forward voltage drop $V_F$ of diode 104. Because the NMOS transistor turns on in the linear region and outputs the drain-source voltage when the high level of 3.3 V is input from the sender side IC, an H level of 3.3 V appears at port B. In addition, the same holds true when a signal input to port A is at the low level (normally 0 V), and a low level of 0 V appears at port B.

In the case of said level shifting circuit, the signal propagation delay time can be reduced to a value very close to zero by reducing the on-resistance of NMOS transistor 100, so that the level of the signal supplied from sender side IC, whether it is 3.3 V or 5 V, can be received by the receiver side IC as a single 3.3 V signal level instantaneously.

However, the level shifting circuit has the following shortcomings or restrictions.

(1) The level can be shifted only to a level lower than bias voltage $V_g$ by threshold voltage $V_{tn}$ of NMOS transistor 100, which is less than power supply voltage $V_{CC}$. Thus, as described above, in order for the receiver side IC or the system which operates at the power supply voltage of 3.3 V to be able to receive signals from a 5 V system as well as a 3.3 V system, power supply voltage $V_{CC}$ of 5 V must be prepared, or the conventional level shifting circuit cannot be used.

(2) If the on-resistance were to be reduced so as to reduce the signal propagation delay time, NMOS transistor 100 would increase in size, and a large parasitic capacitance would be added between the gate and source or gate and drain. Said parasitic capacitance temporarily increases the gate potential through capacitive coupling to cause an overshoot of the output voltage when the input signal changes from low level to high level, so that accurate level shifting is hindered.

(3) Because a steady DC current flows through bias circuit 102, the power consumption is high. In particular, if the resistance value of resistor 106 is reduced to restrain the overshoot caused by the transition from low level to high level, the power consumption is further increased despite the fact that the restraining effect is small.

The present invention was conceived in light of the problems of the prior art, and its purpose is to present a level shifting circuit capable of quickly, reliably, and precisely shifting the level of an arbitrary input signal that is higher than the power supply voltage to an output signal level controlled by the power supply voltage.

Another purpose of the present invention is to present a low power level shifting circuit in which the DC current consumption is reduced.

SUMMARY OF THE INVENTION

According to one aspect of the invention, the level shifting circuit of the present invention is provided with a first MOS transistor whose first terminal is connected to a first port and whose second terminal is connected to a second port, a second MOS transistor of the same conductivity type as the first MOS transistor whose first terminal is connected to a power supply voltage terminal that supplies a power supply voltage corresponding to a reference logic level and whose second terminal and gate terminal are both connected to the gate terminal of the first MOS transistor, and a bias means for supplying a prescribed bias voltage below the power supply voltage to the gate terminal of the first MOS transistor.

In the case of the level shifting circuit according to another aspect of the present invention, when a signal input from the first port has changed from a first logic level to a second logic level, for example, low level to high level, the gate potential is increased by the potential corresponding to the input signal level changes due to the capacitive coupling between the first terminal and the gate terminal of the first MOS transistor, and the second MOS transistor is turned on so as to allow a discharge current to flow from the gate terminal side of the first MOS transistor to the power supply voltage terminal side. Thus, the gate potential of the first MOS transistor is clamped to a potential above the level of the power supply voltage only by the threshold voltage of the second MOS transistor. As a result, an output potential less than the gate potential only by the threshold voltage is obtained at the second terminal of the first MOS transistor.

A high level equal to the power supply voltage can be obtained at the second terminal of the first MOS transistor by setting the threshold voltages of the first and second MOS transistors to essentially the same value.

A third aspect of the invention includes a configuration comprising a first or a second clamping circuit connected between the power supply voltage terminal and the first or second port in order to clamp the potential of the first or second port near the reference logic level. Preferably, in this aspect of the invention, a first or second switch to be turned off when the potential levels of the first and second ports are both logically different from the reference logic level and turned on when the level of the potential of at least the first or the second is logically equal to the reference logic level may be provided in order to reduce the power consumption by the first or second clamping circuit. Thus, the first or second clamping circuit may be provided with a first or second diode in order for it to operate only when needed, or preferably, to allow a forward current flow from the power supply voltage terminal to the first or second port. In addition, it is preferable in this aspect of the invention that the first or second clamping circuit be provided with a first or second constant current source in order to allow a constant current to flow from the power supply voltage terminal to the first or second port.

In addition, another aspect of the present invention has a configuration in which a third diode whose anode is connected to the first port and whose cathode is connected to the gate terminal of the first MOS transistor, or a configuration involving a fourth diode whose anode is connected to the second port and whose cathode is connected to the gate terminal of the first MOS transistor. A drop in the bias voltage due to a leakage current can be effectively prevented by allowing current to flow from said high level signal to the gate of the first MOS transistor via the third or the fourth diode when the high level of the signal input to the first or second port is higher than the gate potential of the first MOS transistor. In this aspect of the invention, a configuration is preferred in which a first or second resistor is connected in series with the third or fourth diode between the first or second port and the gate terminal of the first MOS transistor in order to stabilize the current flowing to the gate of the first MOS transistor or a configuration in which a third or fourth constant current source is connected instead.

In addition, a further aspect of the present invention is configured such that the bias means is provided with a fifth diode whose anode is connected to the power supply voltage terminal and whose cathode is connected to the gate terminal of the first MOS transistor. When the second MOS transistor is not operating, that is, when it is off, the low level on the input side can be transmitted directly to the output side via the first MOS transistor in the on-state by supplying a prescribed bias voltage below the power supply voltage from the power supply voltage terminal to the gate of the first MOS transistor via the fifth diode.

In addition, a still further aspect of the configuration of the present invention concerns a third switch connected in series with the fifth diode between the power supply voltage terminal and the gate terminal of the first MOS transistor, a fourth switch connected between the gate terminal of the first MOS transistor and a reference potential having a logic level different from the reference logic level, and a switch controlling means that turns the third switch on and the fourth switch off and vice versa. With said configuration, the bias circuit can be activated so as to enable a signal to be transmitted between the first port and the second port by turning the third switch on and the forth switch off, and the bias circuit can be essential disabled so as to cut off the first port from the second port by turning the third switch off and the fourth switch on.

When the switching function is provided, according to yet another aspect of the invention, a voltage amplifier is used that increases the voltage at the gate terminal of the first MOS transistor to a level higher than the power supply voltage in response to a control signal supplied from the switch controlling means in order to turn the third switch on and the fourth switch off. When said voltage amplifier is used, the gate voltage of the first MOS transistor is clamped to a potential higher than the power supply voltage only by the threshold voltage by using a change in the logic level of the control signal instead of the change in the logic level of the input signal in order to obtain a logic level equal to the power supply voltage level at the second terminal of the first MOS transistor. This aspect of the present invention comprises a delayed voltage output circuit that boosts its output voltage from a logic level different from the reference logic level to a logic level equal to the reference logic level when a prescribed delay time has passed after the control signal is input, as well as a capacitor connected between the output terminal of said delayed voltage output circuit and the gate terminal of the first MOS transistor. With said configuration, the gate potential of the first MOS transistor can be increased to a desired level by means of charge pumping in response to the change in the logic level of the control signal.

In addition, another aspect of the invention has a configuration comprising a third MOS transistor whose first terminal is connected to the first port and whose second terminal is connected to the second port, a fourth MOS transistor of the same conductivity type as the third MOS transistor, whose first terminal is connected to the power supply voltage terminal whose second terminal and a gate terminal are both connected to the gate terminal of the third MOS transistor, a sixth diode whose anode is connected to the power supply voltage terminal and whose cathode is connected to the gate terminal of the third MOS transistor, a fifth switch connected in series with the sixth diode between the power supply voltage terminal and the gate terminal of the third MOS transistor, a sixth switch connected between the gate terminal of the third MOS transistor and a reference potential having a logic level different from the reference logic level, a switch controlling means that turns the fifth switch on and the sixth switch off and vice versa, and a voltage amplifier that boosts the potential of the gate terminal of the third MOS transistor to a level higher than the power supply voltage in response to a control signal given by the switch controlling means in order to turn the fifth switch on and turn the sixth switch off.

In this configuration, the voltage amplifier operates the same way as that described above in response to the control signal from the switch controlling means, the third MOS transistor performs an operation equivalent to that of the first MOS transistor, and the fourth MOS transistor performs an operation equivalent to that of the second MOS transistor. An embodiment of said voltage amplifier has a configuration comprising the voltage amplifier that boosts its output voltage from a logic level different from the reference logic level to a logic level equal to the reference logic level when a prescribed amount of delay time has passed after the control signal is input, as well as a capacitor connected between the output terminal of said delayed voltage output circuit and the gate terminal of the third MOS transistor.

REFERENCE NUMBERALS AND SYMBOLS AS SHOWN IN THE DRAWINGS

In the FIGS., 10 represents an N-channel MOS transistor (transfer gate transistor), 12 represents a bias circuit, 14 represents an N-channel MOS transistor, 16 represents a diode, 18, 26 represent clamping circuits, 20, 28 represent constant current sources, 22, 30 represent P-channel MOS transistors, 24, 32 represent diodes, 34 represents a NOR circuit, 36, 40 represent diodes, 44 represents a P-channel MOS transistor, 46 represents an N-channel MOS transistor, 56 represents an auxiliary circuit, 56 represents an N-channel MOS transistor, 60 represents a bias circuit, 70 represents a charge pump circuit, 80 represents a constant current source, and 86 represents a resistor.

DESCRIPTION OF THE EMBODIMENTS

The present invention will be explained below with reference to FIGS. 1–10.

Figure 1:
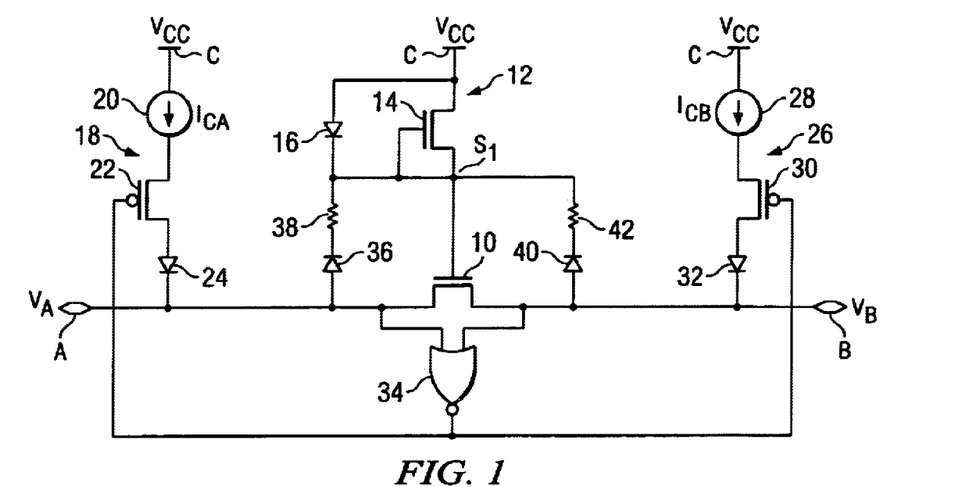
FIG. 1 is a circuit diagram illustrating the circuit configuration of the level shifting circuit in accordance with an embodiment of the present invention.

A configuration of the level shifting circuit in accordance with an embodiment of the present invention is shown in FIG. 1. The level shifting circuit of said embodiment uses NMOS transistor 10 as a transfer gate transistor. Either the source terminal or the drain terminal of NMOS transistor 10 is connected to port A, and the other terminal is connected to port B. Here, for the sake of explanation, it is assumed that the drain terminal is connected to port A, and the source terminal is connected to port B. Ports A and B may each be connected to a digital IC (not shown).

NMOS transistor 10 may be designed as a large MOS transistor so as to obtain sufficiently low on-resistance (for example, 5 Ω or lower). The large size results in a large gate-drain and gate-source capacitance and the capacitive coupling effect is increased. However, as will be explained below, in the present embodiment, the capacitive coupling effect between the drain (source) and the gate in NMOS transistor 10 not only does not result in the problems of the prior art, but is deliberately exploited as a useful technical feature.

The gate terminal of NMOS transistor 10 is connected to bias circuit 12 at node $S_1$. Said bias circuit 12 comprises NMOS transistor 14 and diode 16. The source terminal of NMOS transistor 14 is connected to power supply voltage $V_{CC}$ terminal C, and the drain and gate terminals are connected to the gate terminal common gate-connected NMOS transistor 10 at node $S_1$. The anode terminal of diode 16 is connected to power supply voltage $V_{CC}$ terminal C, and the cathode terminal is connected to the gate terminal of NMOS transistor 10 at node $S_1$.

Said bias circuit 12 has a first bias mode in which a bias voltage is supplied when NMOS transistor 14 is off and diode 16 conducts, and a second bias mode in which a bias voltage is supplied when diode 16 does not conduct and NMOS transistor 14 is on. While in the first bias mode, a bias voltage less than power supply voltage $V_{CC}$ only by forward voltage drop $V_{F16}$ of diode 16 is supplied from node S to the gate of NMOS transistor 10. The second bias mode represents a condition in which the potential at node $S_1$ is higher than power supply voltage $V_{CC}$ by at least threshold voltage $V_{TN14}$ of NMOS transistor 14. NMOS transistor 14 is formed on the same semiconductor chip that NMOS transistor 10 is formed on during the same process. Therefore, threshold voltage $V_{TN14}$ of NMOS transistor 14 can be made essentially equal to threshold voltage $V_{TN10}$ of NMOS transistor 10.

Clamping circuit 18 for clamping the potential of port A close to the level of power supply voltage $V_{CC}$ is connected between power supply voltage $V_{CC}$ terminal C and port A. Said clamping circuit 18 is configured by connecting constant current source 20, P-channel MOS transistor (referred to as "PMOS transistor" hereinafter) 22, and diode 24 in series. When the potential of port A is less than the level obtained by subtracting forward voltage drop $V_{F24}$ of diode 24 from power supply voltage $V_{CC}$ while PMOS transistor 22 is on, diode 24 turns on so as to supply level clamping constant current $i_{CA}$ from constant current source 20 to the load on the side of port A.

On the other hand, clamping circuit 26 for clamping the potential of port B close to the level of power supply voltage $V_{CC}$ is connected between power supply voltage $V_{CC}$ terminal C and port B. Said clamping circuit 26 is configured by connecting constant current source 28, PMOS transistor 30, and diode 32 in series. When the potential of port B is less than the level obtained by subtracting forward voltage drop $V_{F32}$ of diode 32 from power supply voltage $V_{CC}$ when PMOS transistor 30 is on, diode 32 turns on so as to supply level clamping constant current $i_{CB}$ from constant current source 28 to the load on the side of port B.

One of two input terminals of NOR circuit 34 is connected to port A and the other to port B, and the output terminal of NOR circuit 34 is connected to the gate terminals of PMOS transistors 22 and 30 of clamping circuits 18 and 26. When voltages $V_A$ and $V_B$ of port A and B are both at the low level, output voltage of NOR circuit 34 is a logic high, and PMOS transistors 22 and 30 are both off. However, since at least one of voltages $V_A$ and $V_B$ of port A and B goes high, the output voltage of NOR circuit 34 is a logic low, and both PMOS transistors 22 and 30 turn on.

Furthermore, a series circuit comprising diode 36 and resistor 38 is connected between port A and node $S_1$, that is, gate terminal of NMOS transistor 10. When the potential at port A is higher than the potential at node $S_1$, diode 36 conducts in order for a bias-holding or back-up current to flow from port A to node $S_1$.

On the other hand, a series circuit comprising diode 40 and resistor 42 is connected between port B and node $S_0$. When the potential of port B is higher than the potential of node $S_1$, diode 40 conducts in order for a bias-holding or back-up current to flow from port B to node $S_1$.

The operation of said level shifting circuit will now be explained. As an example, operations to be carried out when a signal level of 5 V input from port A is converted into a signal level of 3.3 V and output to port B will be explained. In this case, power supply voltage $V_{CC}$ of 3.3 V shared with the port B side (receiver side) IC or with the system should be supplied to power supply voltage terminal C of said level shifting circuit. Therefore, assuming that forward voltage drop $V_{F16}$ of diode 16 is selected as 0.5 V, for example, at bias circuit 12, a bias voltage of approximately 2.8 V can be obtained at node $S_1$ while in the first bias mode.

Assume that the signal input into port A is at the low level (0 V). At this time, bias circuit 12 is in the first mode, so that it supplies a bias voltage of approximately 2.8 V from node $S_1$. Accordingly, NMOS transistor 10 turns on in the linear region so as to output the drain voltage directly to the source, so that the low level, that is, 0 V, is obtained at port B.

Next, assume that the signal input to port A has changed from low level to high level (5 V). At this time, the potential at the gate, that is, the potential at node $S_1$, is immediately increased from the current 2.8 V or so to close to approximately 7.8, V which is about 5 V more, at NMOS transistor 10 due to the coupling between the drain and gate. As a result, bias circuit 12 switches from the first mode to the second mode, so that diode 16 does not conduct, and NMOS transistor 14 turns on. Then, NMOS transistor 14 turns on so that it saturates so as to let a discharge current flow from node $S_1$ to power supply voltage terminal C in order to restrict or clamp the potential at node $S_1$ to level ($V_{CC}$+$V_{TN14}$) higher than power supply voltage $V_{CC}$ on the source side by threshold voltage $V_{TN14}$.

A transient drain current flows between the drain and source of NMOS transistor 10 at the moment the potential of node $S_1$ is increased. However, because the digital IC connected to port B is usually a capacitive load, and the gate potential gets quickly clamped to fixed level ($V_{CC}$+$V_{TN14}$) as described above, the on-state of the saturated region of NMOS transistor 10 becomes stabilized without causing an overshoot at the point that the source potential has increased from the gate potential ($V_{CC}$+$V_{TN14}$) to a level lower by as much as the threshold voltage $V_{TN10}$, that is, $V_{CC}$ (3.3 V). Thus, the 5 V system high level from port A is converted into 3.3 V system high level and output to port B by said level shifting circuit.

The high level potential (3.3 V) generated at port B when bias circuit 12 switches from the first bias mode to the second bias mode is not changed if the capacitance is only the input impedance of the load (IC) connected to port B. However, because some resistive elements are also present in practice, the potential at port B is likely to drop due to current leakage on the load side.

In the present embodiment, clamping circuit 26 prevents such a drop in potential at port B. That is, the output terminal of NOR circuit 34 goes low at the point port A goes to the high level, and PMOS transistor 30 of clamping circuit 26 turns on. Diode 32 turns on as the potential at port B drops due to the leakage current, and level clamping constant current $i_{CB}$ is supplied from constant current source circuit 28 to the load at port B. The drop in the level caused due to the leakage current is prevented by said level clamping constant current $i_{CB}$, and the potential at port B is clamped close to $V_{CC}$−$V_{F32}$. For example, if forward voltage drop $V_{F32}$ of diode 32 is selected as 0.2 V, the potential of port B is clamped close to 3.1 V. A small current large enough to supplement the leakage current is sufficient as level clamping constant current $i_{CB}$, so that only a low power consumption occurs.

Furthermore, as the output of NOR circuit 34 goes low, PMOS transistor 22 also turns on at clamping circuit 18 on the side of port A. However, because the potential at port A is at high (5 V), diode 24 does not conduct, so that level clamping constant current $i_{CB}$ does not flow.

On the other hand, although the potential of node $S_1$ is clamped to level ($V_{CC}$+$V_{TN14}$) which is higher than power supply voltage $V_{CC}$ by voltage $V_{TN14}$ at bias circuit 12 while in the second bias mode, a small leakage current flows through NMOS transistor 14, so that the potential of node $S_1$ drops gradually. However, because port A is at high (5 V), diode 36 conducts so as to supply current from port A to node $S_1$. Resistor 38 is used to restrict said current in order to reduce the effect on the input signal. Thus, the leakage current of NMOS transistor 14 is canceled, and the potential at node $S_1$ is maintained near ($V_{CC}$+$V_{TN14}$).

In the case of said level shifting circuit, when a 3.3 V system signal is input from port A, the same operations are also carried out by the respective parts. More specifically, when the signal input to port A changes from low to high (3.3 V), the potential at node $S_1$ is increased from the current 2.8 V or so to approximately 6.1 V, that is, an increase of 3.3 V, at bias circuit 12, in order to switch from the first bias mode to the second bias mode. Also, NMOS transistor 14 turns on when it saturates in the same way as described above so as to allow a discharge current to flow from node $S_1$ to power supply voltage terminal C in order to restrict or clamp the potential at node $S_1$ to level ($V_{CC}$+$V_{TN14}$) higher than the source potential, that is, power supply voltage $V_{CC}$, by threshold voltage $V_{TN14}$. Thus, the level lower than gate potential ($V_{CC}$+$V_{TN14}$) by threshold voltage $V_{TN10}$, that is, $V_{CC}$ (3.3 V), is obtained at the source terminal of NMOS transistor 10. NOR circuit 34, clamping circuit 26, and diode 36 also operate in the same manner as described above.

When the signal input from port A has changed from the high level to the low level, the potential at node $S_1$ is immediately reduced close to 1 V due to the capacitive coupling between the drain and gate of NMOS transistor 10, so that bias circuit 12 switches to the first bias mode, NMOS transistor 14 turns off, and diode 16 conducts. As a result, NMOS transistor 10 turns on in the linear region so as to output the voltage of the drain directly to the source, so that the low level of 0 V is obtained at port B. Furthermore, at this time, clamping circuits 18 and 26 turn off both PMOS transistors 22 and 30 when the output of NOR circuit 34 goes high, so that currents $i_{CA}$ and $i_{CB}$ do not flow from constant current source circuits 20 and 28.

In the case of said level shifting circuit, when a voltage lower than power supply voltage $V_{CC}$ (3.3 V) is input at port A, the same level shifting operations are carried out as those carried out when the low level (0 V) is input.

In addition, said level shifting circuit is configured horizontally symmetrically with respect to ports A and B, so that the input/output relationship between ports A and B can be inverted. That is, the level of a signal input from port B can be shifted and output to port A in the same manner as described above.

Figure 2A:
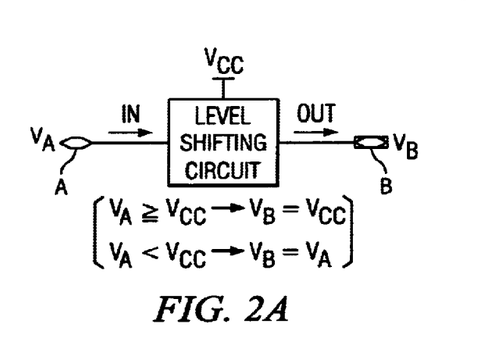
FIG. 2 is block diagrams illustrating input/output function of the level shifting circuit of the embodiment.

The input/output functions of the level shifting circuit of the present embodiment are illustrated in FIG. 2. In FIG.

2(A), port A is the input side, and port B is the output side. In this case, when the high level of the signal input from port A is higher than power supply voltage $V_{CC}$, its level is shifted to a high level equal to power supply voltage $V_{CC}$ before it is output to port B. When the voltage level of the input signal is lower than power supply voltage $V_{CC}$, a voltage level equal to the input voltage level is output to port B.

Figure 2B:
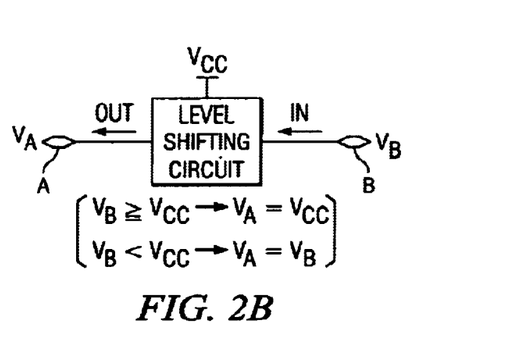

In FIG. 2(B), port B is the input side, and port A is the output side. Thus, when the high level of the signal input from port B is higher than power supply voltage $V_{CC}$, its level is shifted to a high level equal to power supply voltage $V_{CC}$ before it is output to port A. When the voltage level of the input signal is lower than power supply voltage $V_{CC}$, a voltage level equal to the input voltage level is output to port A.

The level shifting circuit of the present embodiment described above has horizontally symmetrical level shifting functions with respect to ports A and B. Thus, when the high level of the input signal is not just equal to but higher than the power supply voltage $V_{CC}$, it can be always shifted to the high level of $V_{CC}$ quickly and reliably. Thus, at the IC or the system on the receiver side, the power supply voltage it uses can be used as power supply voltage $V_{CC}$ of the level shifting circuit in accordance with the present embodiment.

Therefore, when the 3.3 V system is used on the core side in a PCI bus, for example, the power supply voltage of 3.3 V is used for the level shifting circuit of the present embodiment, so that a signal sent from an expansion board, whether it be that of a 3.3 V system or a 5 V system, can be always converted into the 3.3 V system signal level before it is received by the system on the core side. The same holds true when a 2.5 V system is used for the core side. That is, when the 2.5 V system is used for the level shifting circuit, a signal sent from an expansion board, whether it be that of a 2.5 V system, a 3.3 V system, or a 5 V system, can be always converted into the 2.5 V system signal level before it is received by the system on the core side.

In addition, in the case of the level shifting circuit of the present embodiment, although the required minimal transient currents flow at the respective parts, the continuous DC current consumption is low. That is, only level clamping small DC currents $i_{CA}$ and $i_{CB}$ corresponding to the load leakage currents on one side (output signal side) of clamping circuits 18 and 26 flow when the input signal is at the high level. Thus, the power consumption is very low.

Figure 3:
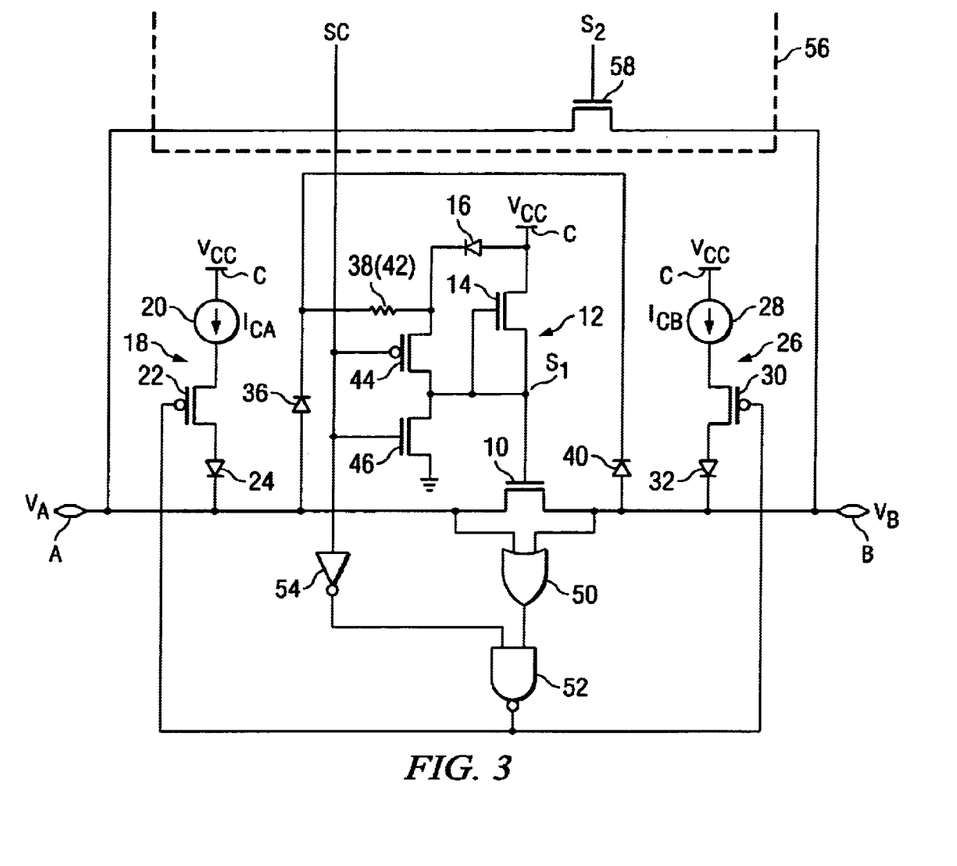
FIG. 3 is a circuit diagram illustrating the circuit configuration of the level shifting circuit in accordance with a second embodiment of the present invention.
Figure 4:
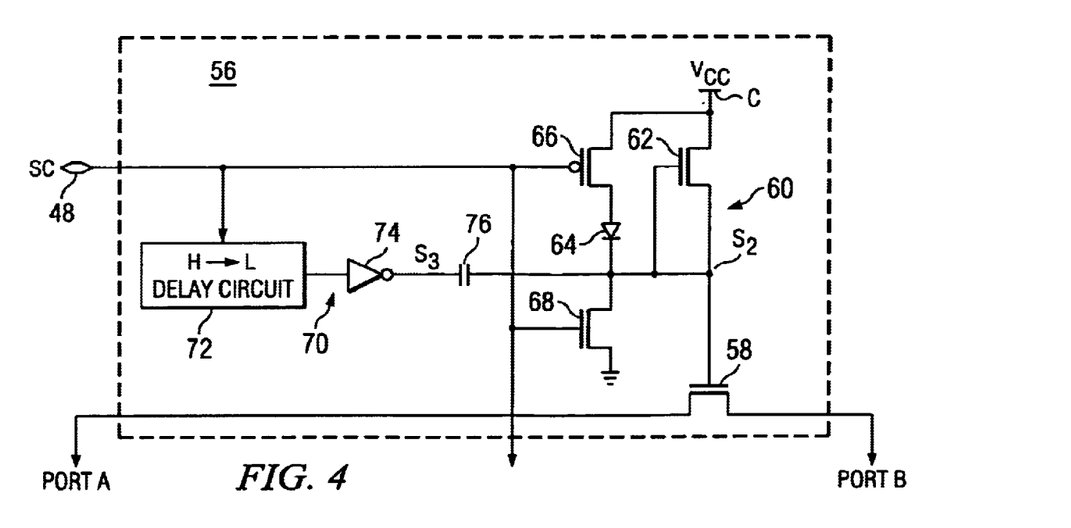
FIG. 4 is a circuit diagram illustrating an auxiliary circuit contained in the level shifting circuit in accordance with the second embodiment of the present invention.

The circuit configuration of the level shifting circuit in accordance with a second embodiment is shown in FIGS. 3 and 4. In the present embodiment, a switching (on/off) function is added to the level shifting circuit in accordance with the first embodiment. For example, in the case of a PCI bus system, a switching (on/off) function is required for the level shifting circuit in order to realize a wire insertion/removal function.

In the present embodiment, bias circuit 12 is provided with PMOS transistor 44 and NMOS transistor 46 in order to turn the ports A and B on and off. More specifically, PMOS transistor 44 is connected in series with diode 16 between terminal C for power supply voltage $V_{CC}$ and node $S_1$, and NMOS transistor 46 is connected between node $S_1$ and GND (ground) level terminal. Binary signal SC for switch controlling is supplied to the gate terminal of MOS transistors 44 and 46 from an external control circuit via signal input terminal 48. The logic high of said switch control signal SC may be equal to power supply voltage $V_{CC}$.

In the present embodiment, NMOS transistor 10 operates as a transfer gate transistor as well as a switch transistor. To turn on NMOS transistor 10 as a switch transistor, switch control signal SC is set to the low level in order to turn PMOS transistor 44 on and NMOS transistor 46 off at bias circuit 12. Here, bias circuit 12 is equivalent to the circuit configuration in the first embodiment. To turn off switch transistor 10, switch control signal SC is set to the high level so as to turn PMOS transistor 44 off and NMOS transistor 46 on at bias circuit 12. As a result, the potential at node $S_1$ is lowered to the low level (0 V), and switch transistor 10 is kept off.

NOR circuit 34 in the first embodiment is replaced by OR circuit 50 and NAND circuit 52 in said second embodiment in order to realize said switching function, and switch control signal SC is supplied to one of the input terminals of NAND circuit 50 via inverter circuit 54. When switch control signal SC is logic high (when switch transistor 10 is turned off), the output of inverter circuit 54 is logic low, and output of NAND circuit 52 is logic high so as to make both clamping circuits 18 and 26 inactive (off). When switch control signal SC is logic low (when switch transistor 10 is turned on), output of inverter circuit 54 is logic high, and OR circuit 50 and NAND circuit 52 are equivalent to NOR circuit 34 in the first embodiment.

The switching operation of said embodiment creates a problem when a high-level signal is input from a port on the sender side, for example, port A, while switch transistor 10 is being turned off, and the external control circuit has switched switch control signal SC from logic high for turning off to logic low for turning on under said high-level input condition.

That is, because there is no capacitive coupling between the drain and gate of switch transistor 10 even when the signal input from port A has changed from low level to high level while switch transistor 10 is off, the gate potential, that is, the potential at node $S_1$, barely rises, so that port B side is in the high-impedance state and remains at the current low level. Then, even when switch control signal SC has changed from logic high to logic low, and PMOS transistor 44 turns on and NMOS transistor 46 turns off, at bias circuit 12, because the transition from low level to high level at port A has already been completed, there is no capacitive coupling between the drain and gate of switch transistor 10 in this situation, either. Therefore, bias circuit 12 remains in the first bias mode and does not switch to the second bias mode. As a result, a high level ($V_{CC}$) signal cannot be output to the source side of switch transistor 10, that is, the port B side.

Furthermore, although PMOS transistor 30 of clamping circuit 26 turns on due to the high level signal input from port A, because current ICB supplied from constant current source circuit 28 to port B is small, it is difficult to boost it from the low level to the high level.

In order to solve this problem, an auxiliary circuit in block 56 is provided in the present embodiment. Said auxiliary circuit 56 has NMOS transistor 58 and bias circuit 60 corresponding to NMOS transistor 10 and bias circuit 12, respectively.

More specifically, in auxiliary circuit 56, drain terminal of NMOS transistor 58 is connected to port A, and its source terminal is connected to port B. Bias circuit 60 has NMOS transistor 62, diode 64, PMOS transistor 66 for switching, and NMOS transistor 68. Source terminal of NMOS transistor 62 is connected to power supply voltage $V_{CC}$ terminal C, and its drain and gate terminals are connected to the common gate terminal of NMOS transistor 58 via node $S_2$.

Threshold voltages $V_{TN58}$ and $V_{TN62}$ of NMOS transistors 58 and 62 may be set to values essentially equal to threshold voltage $V_{TN10}$ of NMOS transistor 10. The anode terminal of diode 64 is connected to power supply voltage $V_{CC}$ terminal C via PMOS transistor 66, and its cathode terminal is connected to the gate terminal of NMOS transistor 58 at node $S_2$. PMOS transistor 66 is connected in series with diode 16 between terminal C of power supply $V_{CC}$ and node $S_2$. NMOS transistor 68 is connected between node $S_2$ and GND level terminal. Switch control signal SC from signal input terminal 48 is supplied to the gate terminals of MOS transistors 66 and 68.

Furthermore, auxiliary circuit 56 has charge pump circuit 70. Said charge pump circuit 70 comprises delay circuit 72, inverter circuit 74, and capacitor 76 connected in series in this order between signal input terminal 48 and node $S_2$. Delay circuit 72 is configured so that its signal delaying function is enabled only when the input signal, that is, switch control signal SC, is switched from logic high to logic low so as to switch its output from the high level to the low level after a delay time of approximately several nanoseconds, for example.

Said auxiliary circuit 56 takes the input of high-level signal from port A on the sender side while switch transistor 10 is off and functions effectively when switch control signal SC is switched from logic high for turning off to logic low for turning on under said high-level input conditions.

Here, PMOS transistor 66 is off, and NMOS transistor 68 is on at auxiliary circuit 56 while switch control signal SC is at logic high, the potential of node $S_2$ is clamped to ground potential, and NMOS transistor 58 is kept off.

NMOS transistor 68 then turns off simultaneously when PMOS transistor 66 turns on at bias circuit 60 as switch control signal SC is switched from logic high to logic low, and power supply voltage $V_{CC}$ is applied to node $S_2$ via diode 64 so as to charge node $S_2$ to $V_{CC}-V_{F64}$. Here, $V_{F64}$ represents the forward voltage drop of diode 64, and it may be set to 0.5 V or so, for example.

As described above, when the potential of node $S_2$ is increased to $V_{CC}-V_{F64}$ at bias circuit 60 under the first bias mode, a low-level voltage is output immediately from delay circuit 72, and output of inverter circuit 74, that is, potential of node $S_3$, is increased from low level to high level. Thus, the potential at node $S_2$ is increased by the increased portion in the potential of node $S_3$, that is, the amount of change from low level to high level (equivalent to the level of $V_{CC}$), from the current level ($V_{CC}-V_{F64}$) due to the coupling effect or charge pumping of capacitor 76. Thus, NMOS transistor 62 turns on in the direction the current flows from node $S_2$ to power supply voltage terminal C so as to clamp the potential of node $S_2$ to $V_{CC}-V_{TN62}$. As a result, an output voltage having a level lower than gate voltage ($V_{CC}-V_{TN62}$) by threshold voltage $V_{TN58}$, that is, $V_{CC}$ level, is obtained at the source of NMOS transistor 58.

The level of the high level above $V_{CC}$ input from port A in the manner is shifted to the high level of the $V_{CC}$ at bias circuit 60 and output to port B. When the potential of port B drops below $V_{CC}$ due to the leakage current on the load side, clamping circuit 26 is activated to clamp the level in the manner.

Furthermore, bias circuit 60 and charge pump circuit 70 in auxiliary circuit 56 operate in the same manner as described above also when low level is input from port A when switch control signal SC is switched from logic high for turning off to logic low for turning on. However, because the drain voltage of NMOS transistor 58 is at the low level, the high level is not output to port B. In addition, when switch control signal SC is switched from logic low for turning on to logic high for turning off, the potential at node $S_2$ is forcibly clamped to GND level so as to turn NMOS transistor 58 on at auxiliary circuit 56.

The input/output characteristics of the level shifting circuit (FIG. 4) of the embodiment have been simulated in a SPICE program and are shown in FIG. 5–FIG. 8.

Figure 5:
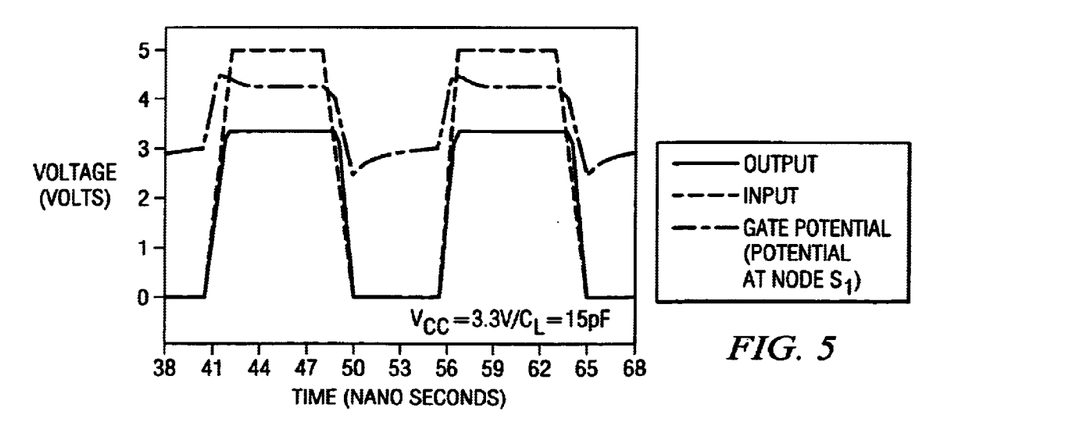
FIG. 5 is a graph illustrating input/output characteristics of the level shifting circuit of an embodiment in a simulation.
Figure 6:
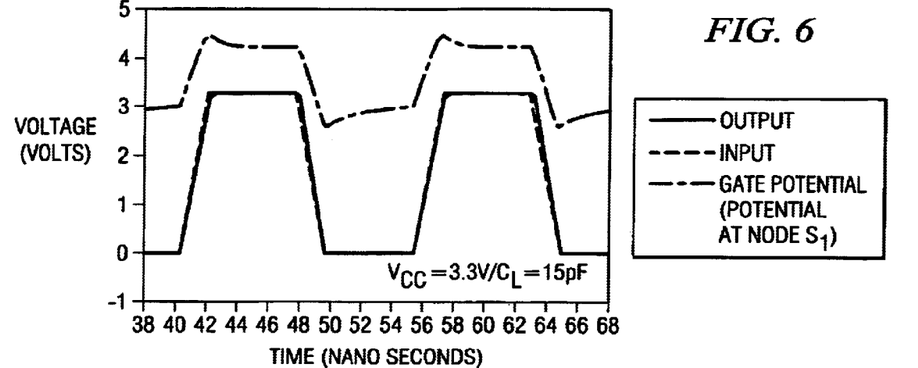
FIG. 6 is a graph illustrating input/output characteristics of the level shifting circuit of an embodiment in a simulation.

In the simulations of FIG. 5 and FIG. 6, 3.3 V is used as power supply voltage $V_{CC}$, only 15 pF capacitance $C_L$ is used for the input impedance of the load on the receiver side, and 5 V and 3.3 V are used as high level at the input side. In the case of 5 V input (FIG. 5) and 3.3 V input (FIG. 6), it is clear that the gate potential (potential at node $S_1$) of NMOS transistor 10 is increased to approximately 4.5 V to 4.3 V when the high level is input due to the capacitive coupling, and the output voltage on the source side is converted into the level of power supply voltage $V_{CC}$ (3.3 V).

Figure 7:
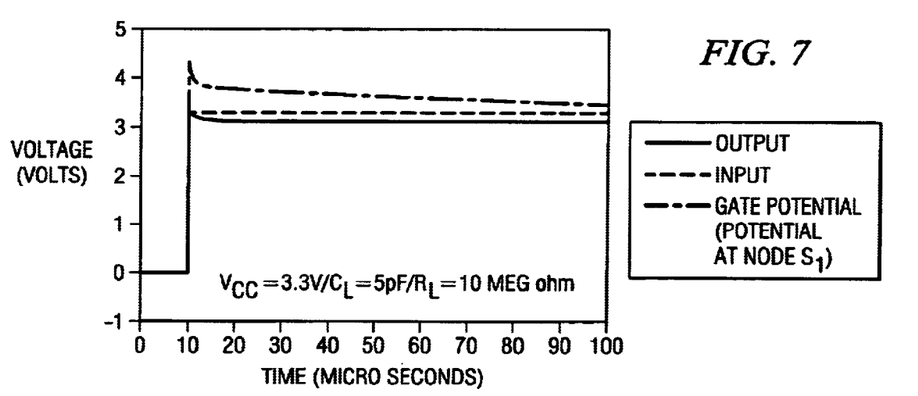
FIG. 7 is a graph illustrating input/output characteristics of the level shifting circuit of an embodiment in a simulation.

The simulation in FIG. 7 shows the waveform of the output voltage obtained when 5 pF capacitance $C_L$ and 10 MΩ resistor were used for the load on the receiver side, and the receiver side voltage was changed from the low level (0 V) to the high level (3.3 V). In this case, the gate potential (potential at node $S_1$) of NMOS transistor 10 increases close to 4.3 V in response to the level change (0 V→3.3 V) at the input side, and an output voltage with the power supply voltage level (3.3 V) is obtained at the source side as a result. Subsequently, the output voltage begins to drop. That is, if the load is totally capacitive with no leakage current, once the output voltage is increased to the power supply voltage (3.3 V), it stays there. However, because the load has some resistance (10 MΩ) and discharges via leakage current, the level of the output voltage begins to drop. However, the level of the output voltage gets stabilized as it drops close to 3.1 V since, as described above, the high level of the output voltage is clamped by the current supplied from the clamping circuit (18 or 26) and balances out to approximately 3.1 V. Thus, it is clear that a stable level shifting operation can be achieved with only a slight drop in the level even when the load contains a leakage current in actual application.

Figure 8:
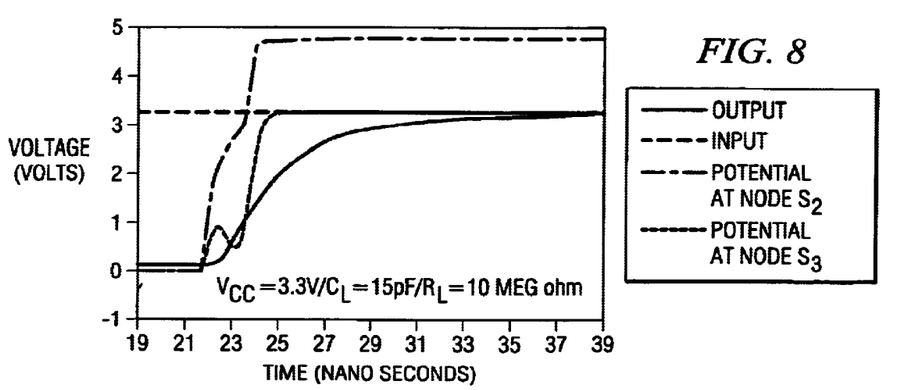
FIG. 8 is a graph illustrating input/output characteristics of the level shifting circuit of an embodiment in a simulation.

FIG. 8 is used to explain the operation of auxiliary circuit 56. As soon as switch control signal SC changes from logic high for turning off to logic low for turning on, the potential at node $S_2$ rises above 2 V. Then, as the potential at node $S_2$ reaches approximately 2.7 V, the potential at node $S_3$ rises from near 0 V to 3.3 V, the potential at node $S_2$ is increased close to 4.7 V through charge pumping, and the output rises to 3.3 V. Thus, it is clear that the output can be switched to a level above 3.0 V in approximately 10 nanoseconds by the operation of auxiliary circuit 56.

Figure 9:
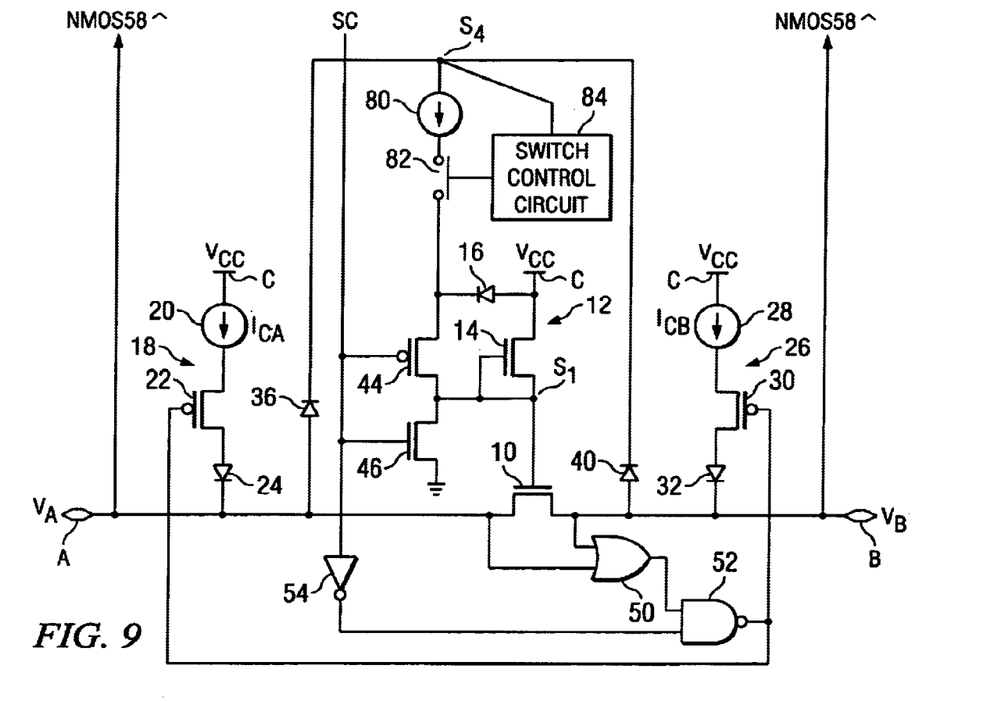
FIG. 9 is a circuit diagram illustrating the circuit configuration of the level shifting circuit in a modification example of an embodiment.

Modification examples of the embodiment are shown in FIG. 9 and FIG. 10. In the case of the modification example in FIG. 9, resistor 38 (42) is replaced by constant current source 80, and switch 82 is inserted into the path for maintaining the bias. Switch control circuit 84 monitors the potential of node $S_4$ on the cathode side of diode 36 so as to turn switch 82 on when the potential at node $S_4$ is higher than power supply voltage $V_{CC}$.

In the case of the modification example in FIG. 10, bidirectional level shifting is enabled between ports A and B when the high level at the port A side is definitely higher than the high level on the port B side. Here, power supply voltage $V_{CCB}$ with a level equal to high level (for example, 3.3 V) on the port B side is supplied to bias circuit 12 and power supply voltage terminal C of clamping circuit 26 on the port B side. On the other hand, separate power supply voltage terminal E is connected to port A via resistor 86, and power supply voltage $V_{CCA}$ having a level equal to the high level (for example, 5 V) on the port A side is supplied to said power supply voltage terminal E.

In the level shifting circuit in FIG. 10, when port A is the input side, and port B is the output side, the same level shifting operation as described above is carried out. Also, when port B is the input side, and port A is the output side, the same level shifting operation as described above is carried out until the point immediately after the input of the high level. That is, when a high level signal is input from port B, a high level signal equal to the high level on the port B side is output to port A. However, since current flows from power supply voltage terminal E to the load on the port A side via resistor 86, the potential of port A increases gradually and saturates (stabilizes) at the level of power supply voltage $V_{CCA}$. In addition, clamping circuit 18 may be added to the circuit of FIG. 10.

Furthermore, in another modification example (not illustrated), constant current source 28 (20) may be replaced by a resistor in clamping circuit 26 (18). In addition, bias circuit 12 and switch transistor 10 can be used to perform a similar function to that of auxiliary circuit 58 by connecting a charge pump circuit equivalent to charge pump circuit 70 of auxiliary circuit 58 at node $S_1$ on the side of bias circuit 12.

As described above, with the level shifting circuit of the present invention, an arbitrary input signal level higher than the power supply voltage used can be quickly, reliably, and accurately shifted to an output signal level controlled by the power supply voltage. In addition, the DC current consumption can be reduced, so that lower power consumption can be realized.

What is claimed is:

1. A level shifting circuit comprising
a first MOS transistor whose first terminal is connected to a first port and whose second terminal is connected to a second port,
a second MOS transistor of the same conductivity type as the first MOS transistor, whose first terminal is connected to a power supply voltage terminal that supplies a power supply voltage corresponding to a reference logic level and whose second terminal and gate terminal are both connected to the gate terminal of the first MOS transistor,
a bias means for supplying a prescribed bias voltage below the power supply voltage to the gate terminal of the first MOS transistor,
a first clamping circuit comprises a first switch which is turned off when the potential levels of the first and second ports have logic levels different from the reference logic level, and it is turned on when the potential of one of the first and the second port has a logic level equal to the reference logic level.

2. The level shifting circuit of claim 1, wherein the first clamping circuit is provided with a first diode for allowing a current to flow in the forward direction from the power supply voltage terminal to the first port.

3. The level shifting circuit of claim 2, wherein the first clamping circuit is provided with a first constant current source circuit for allowing a constant current to flow from the power supply voltage terminal to the first port.

4. The level shifting circuit of claim 3, comprising a second clamping circuit connected between the power supply voltage terminal and the second port in order to clamp the potential of the second port near the reference logic level.

5. The level shifting circuit of claim 4, wherein the second clamping circuit comprises a second switch which is turned off when the potential levels of the first and second ports have logic levels different from the reference logic level, and it is turned on when the potential of one of the and the second ports is logically equal to the reference logic level.

6. The level shifting circuit of claim 5, wherein the second clamping circuit is provided with a second diode for allowing a current to flow in the forward direction from the power supply voltage terminal to the second port.

7. The level shifting circuit of claim 4, wherein the second clamping circuit is provided with a second constant current source circuit for allowing a constant current to flow from the power supply voltage terminal to the second port.

8. The level shifting circuit of claim 7, comprising a third diode whose anode is connected to the first port, and whose cathode is connected to the gate terminal of the first MOS transistor.

9. The level shifting circuit of claim 8, further comprising a first resistor connected in series with the third diode between the first port and the gate terminal of the first MOS transistor.

10. The level shifting circuit of claim 8, further comprising a third constant current source circuit connected in series with the third diode between the first port and the gate terminal of the first MOS transistor.

11. The level shifting circuit of claim 9, further comprising a fourth diode whose anode is connected to the second port, and whose cathode is connected to the gate terminal of the first MOS transistor.

12. The level shifting circuit of claim 11, further comprising a second resistor connected in series with the fourth diode between the second port and the gate terminal of the first MOS transistor.

13. The level shifting circuit of claim 11, wherein the bias means is provided with a fifth diode whose anode is connected to the power supply voltage terminal, and whose cathode is connected to the gate terminal of the first MOS transistor.

14. The level shifting circuit of claim 13, further comprising a third switch connected in series with the fifth diode the power supply voltage terminal and the gate terminal of the first MOS transistor,
a fourth switch connected between the gate terminal of the first MOS transistor and a reference potential logic level different from the reference logic level, and
a switch control means that turns the third switch on and the fourth switch off and vice versa.

15. The level shifting circuit of claim 14, further comprising a voltage amplifier which increases the potential of the gate terminal of the first MOS transistor to a level higher than the power supply voltage in response to a control signal given by the switch control means in order to turn the third switch on and turn the fourth switch off.

16. The level shifting circuit of claim 15, wherein the voltage amplifier circuit is provided with a delayed voltage output circuit that increases its output voltage from a logic level different from the reference logic level to a logic level equal to the reference logic level after a prescribed delay time has passed after the control signal is input, as well as with a capacitor connected between the output terminal of the delayed voltage output circuit and the gate terminal of the first MOS transistor.

17. The level shifting circuit of claim 14, further comprising a third MOS transistor whose first terminal is connected to the first port and whose second terminal is connected to the second port, a fourth MOS transistor of the same conductivity type as the third MOS transistor whose first terminal is connected to the power supply voltage terminal and whose second terminal and gate terminal are both connected to the gate terminal of the third MOS transistor, a sixth diode whose anode is coupled to the power supply voltage terminal and whose cathode is connected to the gate terminal of the third MOS transistor, a fifth switch connected in series with the sixth diode between the power supply voltage terminal and the gate terminal of the third MOS transistor, a sixth switch connected between the gate terminal of the third MOS transistor and a reference potential having a logic level different from the reference logic level, a switch control means that turns the fifth switch on and the sixth switch off and vice versa, and a voltage amplifier that increases the potential of the gate terminal of the third MOS transistor to a level higher than the power supply voltage in response to a control signal given by the switch control means in order to turn the fifth switch on and turn the sixth switch off.

18. The level shifting circuit of the claim 17, wherein the voltage amplifier is provided with a delayed voltage output circuit that increases its output voltage from a logic level different from the reference logic level to a logic level equal to the reference logic level after a prescribed amount of delay time has passed after the control signal is input, as well as with a capacitor connected between the output terminal of the delayed voltage output circuit and the gate terminal of the third MOS transistor.

19. A level shifting circuit comprising a first MOS transistor connected between a first input/output terminal and a second input/output terminal, a second MOS transistor connected between a first power supply voltage terminal and the gate terminal of the first MOS transistor and whose gate terminal is connected to the gate terminal of the first MOS transistor, a first rectifying element connected between a first power supply voltage terminal and the gate terminal of the first MOS transistor in order to source current from the first power supply voltage terminal to the gate terminal of the first MOS transistor, a second rectifying element connected between the first input/output terminal and the gate terminal of the first MOS transistor in order to source current from the first input/output terminal to the gate terminal of the first MOS transistor, a third rectifying element connected between the second input/output terminal and the gate terminal of the first MOS transistor in order to source current from the second input/output terminal to the gate terminal of the first MOS transistor, a third MOS transistor connected between the first power supply voltage terminal and the first input/output terminal, a fourth rectifying element connected between the third MOS transistor and the first input/output terminal in order to source current from the first power supply voltage terminal to the first input/output terminal, a fourth MOS transistor connected between the first power supply voltage terminal and the second input/output terminal, a fifth rectifying element connected between the fourth MOS transistor and the second input/output terminal in order to source current from the first power supply voltage terminal to the second input/output terminal, and a logic circuit whose first and second input terminals are connected to the first and the second input/output terminals, respectively, in order to output a control signal to turn on the fourth and fifth MOS transistors when the voltage level of the first and/or the second input/output terminal corresponds to the power supply voltage.

20. The level shifting circuit of claim 19, wherein the first and second MOS transistors are NMOS transistors, the third and fourth MOS transistors are PMOS transistors, the first rectifying element is a diode whose anode is connected to the first power supply voltage terminal and whose cathode is connected to the gate terminal of the first MOS transistor, the second rectifying element is a diode whose anode is connected to the first input/output terminal and whose cathode is connected to the gate terminal of the first MOS transistor, the third rectifying element is a diode whose anode is connected to the second input/output terminal and whose cathode is connected to the gate terminal of the first MOS transistor, the fourth rectifying element is a diode whose anode is connected to the third MOS transistor and whose cathode is connected to the first input/output terminal, and the fifth rectifying element is a diode whose anode is connected to the fourth MOS transistor and whose cathode is connected to the second input/output terminal.

21. The level shifting circuit of claim 19, comprising a fifth MOS transistor connected between the first rectifying element and the gate terminal of the first MOS transistor in order to cut off the current path formed between the first rectifying element and the gate terminal of the first MOS transistor, the current path between the second rectifying element and the gate terminal of the first MOS transistor, and the current path between the third rectifying element and the gate terminal of the first MOS transistor, a sixth MOS transistor connected between the gate terminal of the first MOS transistor and the second power supply voltage terminal, and a control circuit that supplies a control signal in order to make the fifth MOS transistor and the sixth MOS transistor conductive in a complementary manner.

* * * * *